(12) United States Patent
Derner

(10) Patent No.: US 6,367,039 B1
(45) Date of Patent: *Apr. 2, 2002

(54) METHOD AND APPARATUS FOR TESTING ADJUSTMENT OF A CIRCUIT PARAMETER

(75) Inventor: Scott Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/644,197

(22) Filed: Aug. 22, 2000

Related U.S. Application Data

(63) Continuation of application No. 08/927,164, filed on Sep. 11, 1997, now Pat. No. 6,108,804.

(51) Int. Cl.[7] .............................................. G11C 29/00
(52) U.S. Cl. ........................ 714/721; 714/733; 324/416
(58) Field of Search ................................ 714/725, 721, 714/733; 341/120; 327/543, 408; 365/185.21, 195; 320/132; 324/416, 347; 345/195, 515; 347/62

(56) References Cited

U.S. PATENT DOCUMENTS

| | | | |
|---|---|---|---|
| 3,978,477 A | 8/1976 | Schmitz | 345/515 |
| 4,739,250 A * | 4/1988 | Tanizawa | 714/725 |
| 5,361,001 A | 11/1994 | Stolfa | 327/530 |
| 5,440,305 A * | 8/1995 | Signore et al. | 341/120 |
| 5,450,030 A | 9/1995 | Shin et al. | 327/525 |
| 5,517,455 A | 5/1996 | McClure et al. | 365/225.7 |
| 5,563,546 A | 10/1996 | Tsukada | 327/408 |
| 5,563,549 A * | 10/1996 | Shieh | 327/543 |
| 5,646,948 A | 7/1997 | Kobayashi | 365/195 |
| 5,742,307 A | 4/1998 | Watrobski et al. | 347/62 |
| 5,815,511 A | 9/1998 | Yamamoto | 714/43 |
| 5,838,076 A | 11/1998 | Zarrabian et al. | 307/115 |
| 5,917,754 A * | 6/1999 | Pathak et al. | 365/185.21 |
| 5,965,997 A * | 10/1999 | Alwardi et al. | 320/132 |

\* cited by examiner

Primary Examiner—David Ton
(74) Attorney, Agent, or Firm—Dorsey & Whitney LLP

(57) ABSTRACT

A voltage regulator is disclosed which is coupled with a programmable trimming circuit by a trim test circuit. When disabled, the trim test circuit passes the logic states of the signals produced by the trimming circuit to the voltage regulator. When enabled, the trim test circuit applies signals to the voltage regulator which correspond with asserted logic states of signals producible by the trimming circuit. Thus, the effect of the trimming circuit on the voltage regulator is testable without actual programming of the trimming circuit.

38 Claims, 3 Drawing Sheets

US 6,367,039 B1

METHOD AND APPARATUS FOR TESTING ADJUSTMENT OF A CIRCUIT PARAMETER

CROSS-REFERENCE TO RELATED APPLICATION

This application is a continuation of pending U.S. patent application Ser. No. 08/927,164, filed Sep. 11, 1997 now U.S. Pat. No. 6,108,804.

TECHNICAL FIELD

This invention relates generally to integrated circuits having adjustable circuit parameters, and more particularly, to methods and apparatus for testing adjustment of these circuit parameters.

BACKGROUND OF THE INVENTION

During manufacture of integrated circuits, a wide variety of operating characteristics and circuit functions are tested. Because integrated circuit fabrication involves a number of process steps, variations in circuit parameters are commonplace. Thus, integrated circuits are commonly designed to include adjustable circuit parameters, in which adjustment of these parameters occurs following completed fabrication. For example, many integrated circuits include a voltage regulator which receives an externally applied supply voltage and produces a regulated supply voltage for use by other circuitry internal to the integrated circuit. The magnitude of this internal supply voltage is typically adjusted following completed fabrication of the integrated circuit to provide a regulated voltage at the appropriate operating level.

FIG. 1 depicts a voltage regulator 10 of the type used in a wide variety of integrated circuits. The voltage regulator 10 includes a voltage reference circuit 12 and a power stage circuit 14, whose configuration and operation are well known to those skilled in the art. The voltage reference circuit 12 receives an input voltage $V_{IN}$ which is a function of the externally applied supply voltage $V_{CCX}$, as described below. The voltage reference circuit 12 then produces a reference voltage output $V_{REF}$ which is input to the power stage circuit 14. The power stage circuit 14 correspondingly produces a regulated supply voltage $V_{CCR}$ for powering other circuits internal to the integrated circuit in which the voltage regulator 10 is included.

Diodes D1 and D2 are connected in series between the external supply voltage $V_{CCX}$ and a node between the power stage circuit 14 and the voltage reference circuit 12. As will be understood by those skilled in the art, these diodes are used during burn-in testing, essentially clamping the voltage of the node to a fixed level below $V_{CCX}$, once $V_{CCX}$ exceeds an expected operating range.

A plurality of transistors T1–T4 is connected in series with a resistor R between the external supply voltage $V_{CCX}$ and ground potential. As depicted, each of the transistors T1–T4 is a PMOS transistor with its gate connected to ground potential. Typically, these transistors have the same channel width and different channel lengths, and these transistors function essentially like resistors. Each of the transistors T1–T4 is connected to a corresponding one of shunting elements S1–S4, which are switching PMOS transistors connected in parallel with the corresponding transistor. In response to a corresponding one of signals FUSE1*–FUSE4* applied to its gate, each of the shunting elements S1–S4 can selectively electrically bypass the corresponding one of the transistors T1–T4, thereby selectively varying the resistance provided by the transistors. The input voltage $V_{IN}$ applied to the voltage reference circuit 12 is produced at a node between the resistor R and the transistors T1–T4. Depending on which of the transistors T1–T4 is electrically shunted, if any, the magnitude of the input voltage $V_{IN}$ is correspondingly adjusted. This affects the magnitude of the produced reference voltage $V_{REF}$, which in turn affects the regulated internal supply voltage $V_{CCR}$.

A trimming circuit 16 includes a plurality of programmable fuse elements F1–F4. Each of the fuse elements F1–F4 is connected in series with a corresponding one of a plurality of transistors 18 between the external supply voltage $V_{CCX}$ and ground potential. As depicted, each of the transistors 18 is a PMOS transistor with its gate tied to ground potential and acts as a pull-up transistor. The trimming circuit 16 also includes a plurality of inverters 20, each of which has its input connected to a node between the corresponding fuse element F1–F4 and transistor 18. The output signal produced by each of the inverters 20 is the corresponding one of the signals FUSE1*–FUSE4*. When, for example, the fuse element F1 is programmed (i.e., is blown), the input to the corresponding inverter 20 is held at a high logic state, and the signal FUSE1* is then asserted at a low logic state. When the fuse element F1 is not programmed, the input to the inverter 20 is then held at a logic low state, and the output signal FUSE1* is correspondingly deasserted.

During mass production of integrated circuits having a trimmable voltage regulator like that depicted in FIG. 1, measurements of the various producible $V_{CCR}$ magnitudes are recorded. Typically, fuse elements are blown and the resulting effect on regulator output is recorded in what is called a trim table. The trim table is usually created by hand measurement of the change in $V_{CRC}$ resulting from each fuse that is blown. For some relatively unstable fabrication processes, the resulting trim table can vary widely from lot to lot, wafer to wafer, and even from die to die. Creation of trim tables is time consuming, and many die may be tested to create an accurate trim table for an entire lot. Also, during creation of trim tables, the value of the regulated supply voltage $V_{CCR}$ is necessarily permanently altered on those die being tested. Thus, significant inefficiencies exist in current methods of testing and trimming integrated circuits.

SUMMARY OF THE INVENTION

In accordance with the principles of the present invention, an integrated circuit is provided which includes a primary circuit, a programmable trimming circuit, and a test circuit. The primary circuit has an adjustable circuit parameter, and the programmable trimming circuit is coupled with the primary circuit to apply a first trimming signal to adjust the primary circuit parameter. A test circuit is also coupled with the primary circuit, and is operable to apply a second trimming signal to the primary circuit to test adjustment of the primary circuit parameter. The programmable trimming circuit may be coupled with the primary circuit by the test circuit, with the test circuit passing the first trimming signal to the primary circuit when the test circuit is disabled. When enabled, the test circuit may then block the first trimming signal and substitute therefor the second trimming signal. The primary circuit may be included within a memory device, which in turn may be included within a computer system.

DETAILED DESCRIPTION OF THE INVENTION

In the following description, certain specific details are set forth in order to provide a thorough understanding of various embodiments of the present invention. However, those skilled in the art will understand that the present invention may be practiced without these details. In other instances, well-known circuit structures and configurations have not been shown in detail in order not to unnecessarily obscure the description of the embodiments of the invention.

Figure 1:
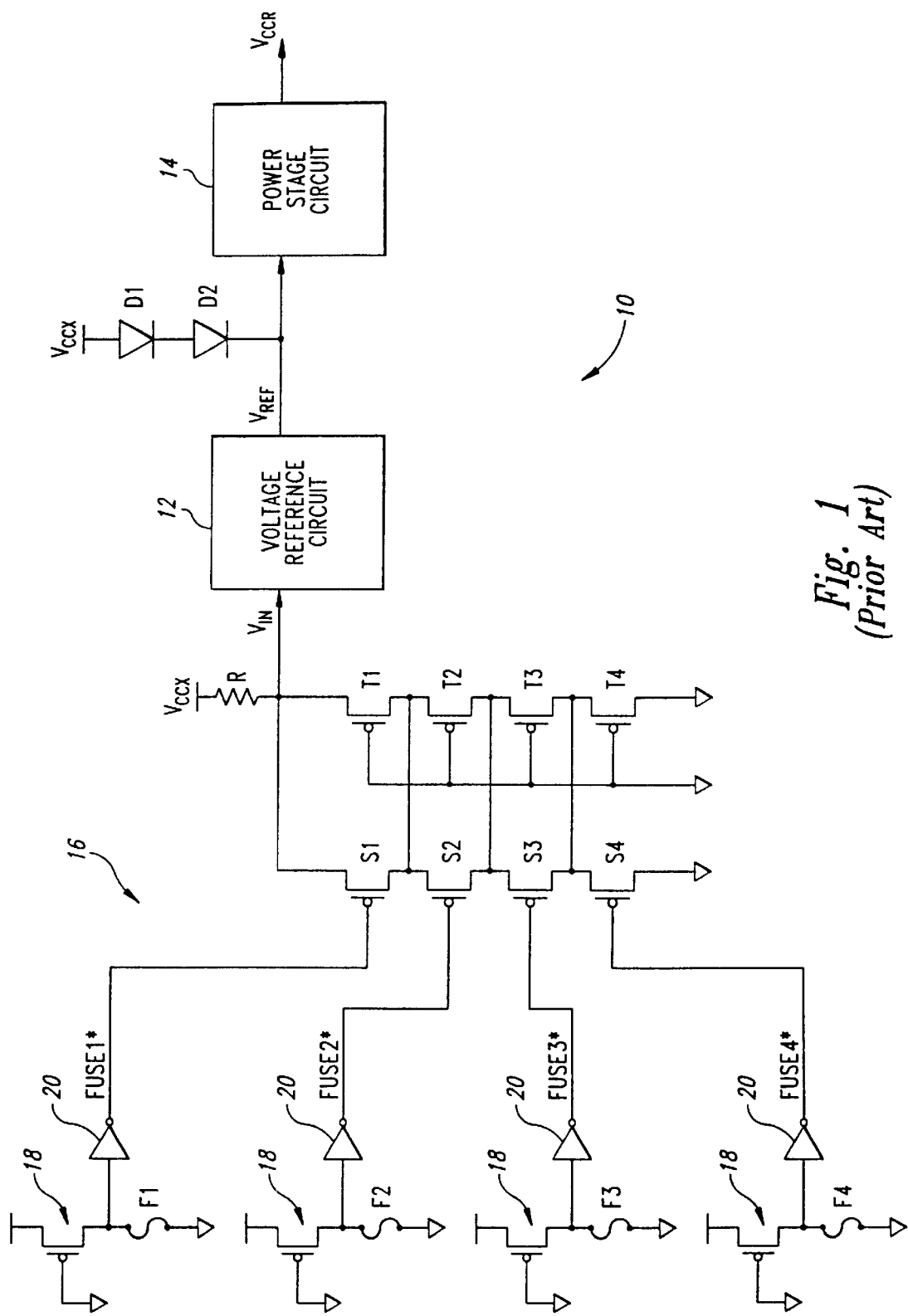
FIG. 1 is a part block, part schematic diagram depicting a voltage regulator and a trimming circuit in accordance with the prior art.
Figure 2:
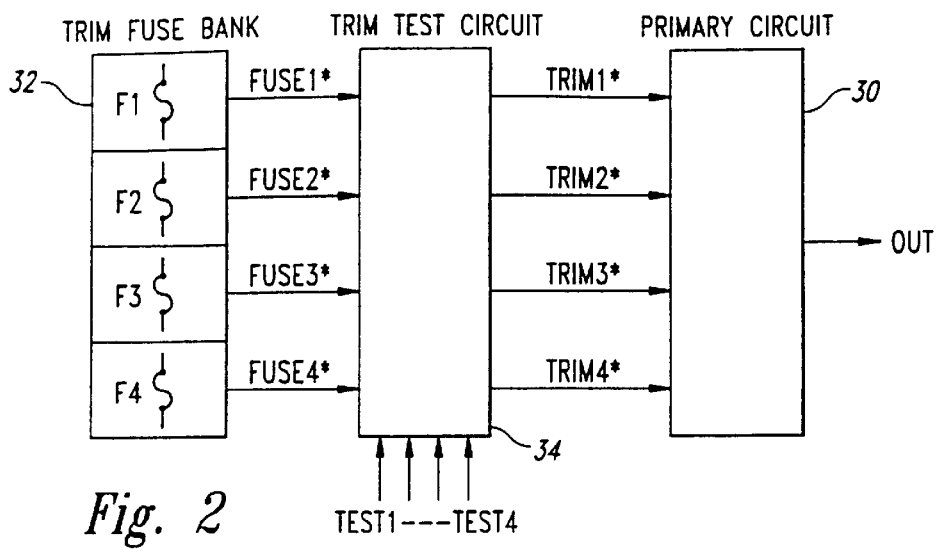
FIG. 2 is a functional block diagram depicting a trimmable primary circuit coupled with a trimming circuit and a trim test circuit in accordance with an embodiment of the present invention.

FIG. 2 is a functional block diagram of an integrated circuit that includes a primary circuit 30 having an adjustable circuit parameter, such as an output signal OUT. A programmable trimming circuit, such as a trim fuse bank 32, is coupled with the primary circuit 30 by a trim test circuit 34 to adjust the primary circuit parameter OUT. The trim fuse bank includes non-volatile programmable elements, such as fuses F1–F4, whose various combinations of programmed states affect the value of the adjustable primary circuit parameter OUT. Depending upon the programmed state (i.e., blown or unblown) of the fuses F1–F4, a corresponding logic state of respective signals FUSE1*–FUSE4* is produced by the trim fuse bank 32.

The trim test circuit 34 receives the signals FUSE1*–FUSE4*, and also receives test signals TEST1–TEST4. The test signals TEST1–TEST4 may be produced by other circuitry (not shown) included in the integrated circuit, or may be externally applied to test pads on a fabricated die containing the integrated circuit. The trim test circuit 34 produces trimming signals TRIM1*–TRIM4*, each of which has a logic state determined by the combination of logic states of respective ones of the FUSE1*–FUSE4* signals and the TEST1–TEST4 signals. In accordance with one embodiment of the present invention, the effect of the various combinations of blown and unblown states of the fuses F1–F4 is testable, without actually blowing any fuses, by applying corresponding combinations of first and second logic states of the test signals TEST1–TEST4.

Figure 3A:
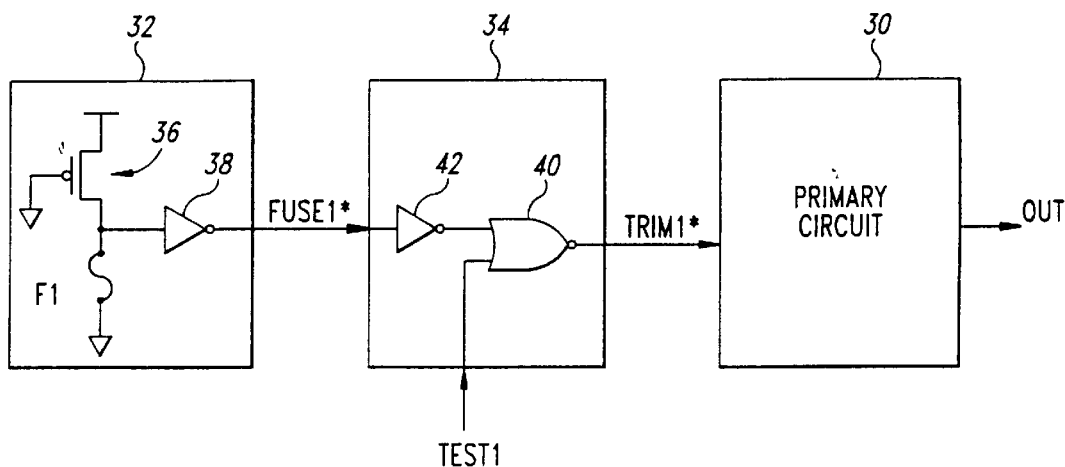
FIG. 3A is a part block, part schematic, part logic diagram depicting exemplary portions of the circuitry depicted in FIG. 2.

FIG. 3A depicts exemplary portions of the circuitry shown in FIG. 2. The example portion of the trim fuse bank 32 shown is similar to that described above in connection with the prior art. Included is the fuse F1 connected in series with a PMOS transistor 36 between supply and ground potentials. The input of an inverter 38 is connected to a node between the fuse F1 and the transistor 36, and the output of the inverter produces the signal FUSE1*. The example portion of the trim test circuit 34 includes a NOR gate 40 and an inverter 42. The input of the inverter 42 receives the FUSE1* signal, and the output of the inverter 42 is applied to one of two inputs of the NOR gate 40. The second of the inputs to the NOR gate 40 receives the test signal TEST1, and the output of the NOR gate produces the trimming signal TRIM1*.

The logic state of the trim signal TRIM1* is determined by the combination of logic states of the FUSE1* and TEST1 signals. When the logic state of the TEST1 signal is low, the NOR gate 40 functions essentially as an inverter, and the logic state of the TRIM1* signal is the same as that of the FUSE1* signal. Thus, a logic low or deasserted state of the TEST1 signal functionally passes the logic state of the FUSE1* signal through the trim test circuit 34 to the primary circuit 30. When the TEST1 signal is asserted (i.e., a logic high state), the output of the NOR gate 40 is a logic low state independent of the logic state of the FUSE1* signal. Thus, an asserted TEST1 signal asserts the TRIM1* signal (i.e., a logic low state). This mimics the effect of an asserted FUSE1* signal when the test circuit 34 is disabled.

Those skilled in the art will appreciate a number of important advantages achieved by the trim test circuit 34 described in connection with FIGS. 2 and 3A. For example, the effect on the primary circuit 30 of a blown or unblown fuse is testable electronically, without actually blowing any fuses. Thus, testing integrated circuit production lots may be conveniently performed automatically and electronically, and fuses need only be blown when producing the end product—namely, the primary circuit 30 having the desired circuit parameter value. Trim tables may be easily produced, and can even be produced for each die, without sacrifice of any of the die.

Those skilled in the art will appreciate that any of a wide variety of circuit components and configurations may be substituted for those particular components and configurations described above in connection with FIGS. 2 and 3A. For example, any of a wide variety of non-volatile programmable elements may be employed in place of the described fuses. Further, the trim test circuit 34 or functional equivalent need not itself be coupled between the programmable trimming circuit 32 and the primary circuit 30. Those skilled in the art will appreciate a number of alternative configurations, in which the trim test circuit 34 tests the effect on the primary circuit 30 of the logic state combinations producible by the trimming circuit 32. Also, any of a wide variety of circuit components and configurations could be substituted for the particular NOR gate 40 and inverter 42 included in the exemplary portion of the trim test circuit 34.

Figure 3B:
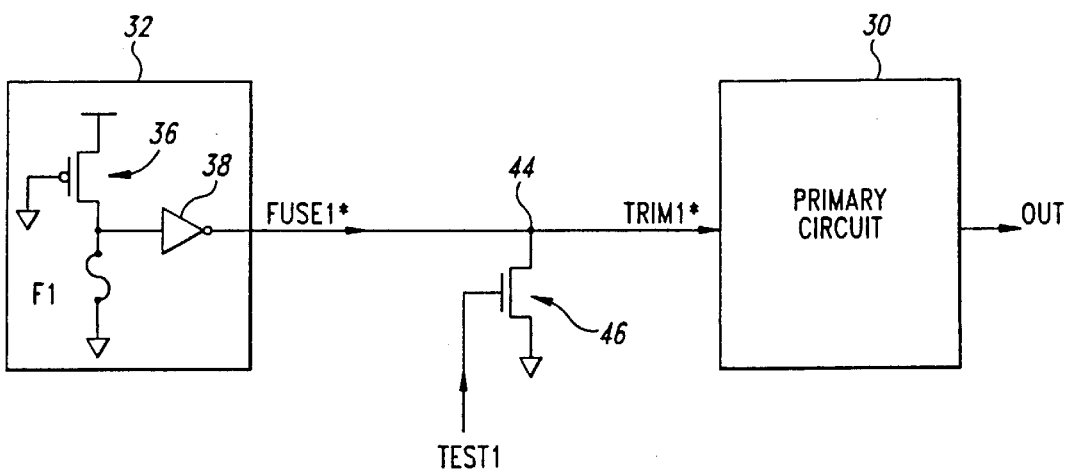
FIG. 3B is a part block, part schematic diagram depicting an alternate embodiment of the present invention.

FIG. 3B shows an alternative approach to testing the effect of the logic state combinations producible by the trimming circuit 32 on the primary circuit 30. In this case, the primary circuit 30 and the trimming circuit 32 are connected directly to each other at a node 44. A transistor 46 is connected in series between the node 44 and ground potential. The test signal TEST1 is applied to the gate of the transistor 46. When the test signal TEST1 is asserted, the transistor 46 pulls down the potential of the node 44, thereby asserting the trim signal TRIM1*. This mimics the effect of an asserted FUSE1* signal during normal, non-test operations (i.e., when TEST1 is deasserted).

Figure 4:
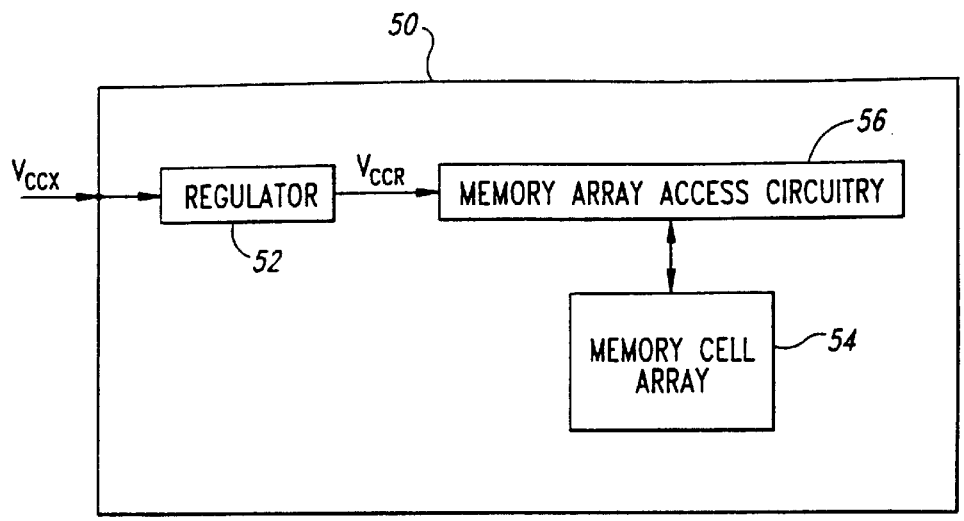
FIG. 4 is a functional block diagram depicting a memory device in accordance with an embodiment of the present invention.

One important application of a primary circuit having an adjustable circuit parameter is that of a voltage regulator producing an adjustable regulated voltage. FIG. 4 depicts one such application, showing a memory device 50 having a trimmable voltage regulator 52 constructed in accordance with the present invention. The voltage regulator 52 receives an external supply voltage $V^{CCX}$ applied to the memory device 50. The voltage regulator 52 then produces a regulated internal supply voltage $V_{CCR}$ which is adjustable in accordance with embodiments of the invention described above in connection with FIGS. 2, 3A and 3B. The regulated internal supply voltage $V_{CCR}$ is used for powering other circuitry included in the memory device 50. Such circuitry includes a memory cell array 54, for storing data, and memory array access circuitry 56, for reading data from and writing data to the memory cell array. The memory array access circuitry 56 includes circuitry such as row and column address decode circuitry, sense amplifier and I/O gating circuitry, and data input and output circuitry. The memory array access circuitry 56 and voltage regulator 52 are included in what is commonly called peripheral circuitry of the memory device 50. Of course, those skilled in the art will appreciate that the present invention may be applied to any of a wide variety of circuits, including a wide variety of memory devices.

Figure 5:
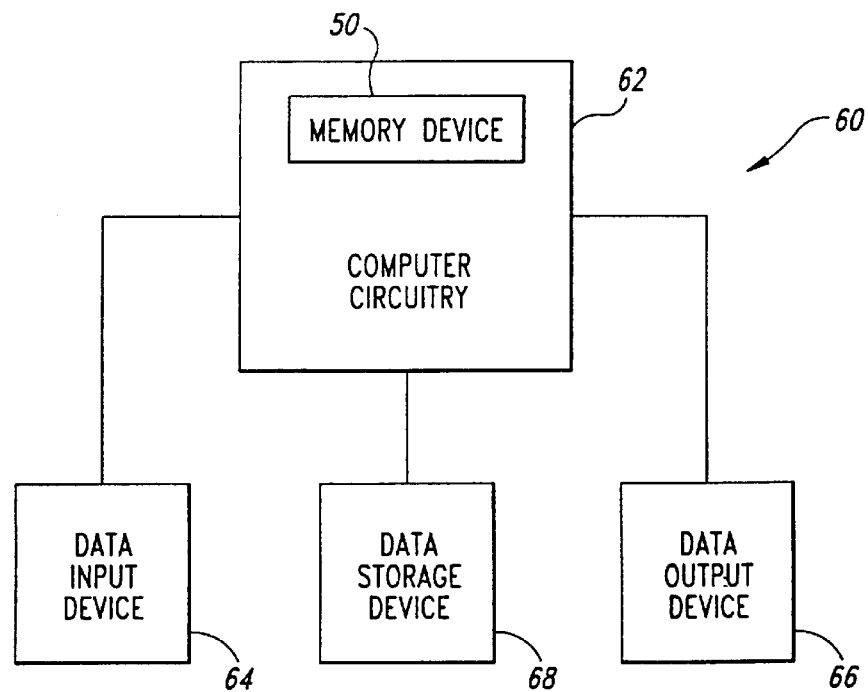
FIG. 5 is a functional block diagram depicting a computer system having the memory device of FIG. 4.

FIG. 5 is a functional block diagram of a computer system 60 having the memory device 50 of FIG. 4. The computer system 60 includes computer circuitry 62 for such computer functions as executing software to perform desired calculations and tasks. The computer circuitry 62 typically includes a processor (not shown) and the memory device 50 as shown. One or more data input devices 64 is coupled to the computer circuitry 62 to allow an operator (not shown) to manually input data (including instructions) to the computer system 60. Examples of data input devices 64 include a keyboard and a pointing device. One or more data output devices 66 is coupled to the computer circuitry 62 to provide data to the operator. Examples of data output devices 66 include a printer and a video display unit. One or more data storage devices 68 is coupled to the computer circuitry 62 to store data and/or retrieve data from external storage media (not shown). Examples of storage devices 68 and associated storage media include drives that accept floppy and hard disks, magnetic tape recorders, and compact-disk read-only memory (CD-ROM) readers.

It will be appreciated that, although specific embodiments of the invention have been described herein for purposes of illustration, various modifications may be made without deviating from the spirit and scope of the invention. Numerous variations are well within the scope of the invention. Accordingly, the invention is not limited except as by the appended claims.

What is claimed is:

1. An integrated circuit, comprising:
    a voltage regulator operable to produce an output voltage, the voltage regulator being further operable to receive a plurality of regulator trimming signals, each having first and second logic states, the magnitude of the output voltage being determined by the combination of logic states of the regulator trimming signals;
    a programmable trimming circuit coupled with the voltage regulator and operable to produce a first set of trimming signals, the programmable trimming circuit having a plurality of programmable elements, each having first and second programmed states, the logic state of each of the first set of trimming signals being determined by the programmed state of a corresponding one of the programmable elements;
    a trim test circuit coupled with the voltage regulator and operable to receive a plurality of test signals and to produce a second set of trimming signals in response thereto; and
    wherein the combination of logic states of the regulator trimming signals corresponds with the combination of logic states of one of the first and second sets of trimming signals.

2. The integrated circuit of claim 1 wherein the trim test circuit couples the programmable trimming circuit with the voltage regulator and is operable to receive the first set of trimming signals, and wherein the trim test circuit has first and second operating modes, the trim test circuit in the first operating mode producing the regulator trimming signals in the combination of logic states corresponding to the combination of logic states of the first set of trimming signals.

3. The integrated circuit of claim 1 wherein the trim test circuit couples the programmable trimming circuit with the voltage regulator and is operable to receive the first set of trimming signals, and wherein the trim test circuit has first and second operating modes, the trim test circuit in the second operating mode producing the regulator trimming signals in the combination of logic states corresponding to the combination of logic states of the second set of trimming signals.

4. The integrated circuit of claim 1 wherein the programmable elements are non-volatile programmable elements.

5. The integrated circuit of claim 1 wherein the programmable elements are fuses.

6. An integrated circuit, comprising:
    a programmable trimming circuit including a plurality of programmable elements, the programmable trimming circuit operable to produce a plurality of first trim signals having a first or a second logic levels corresponding to the programmed or unprogrammed states, respectively, of respective programmable elements;
    a test circuit operable in enabled and disabled modes, the test circuit being operable in the enabled mode to produce a plurality of second trim signals having first or second logic levels, the second trim signals corresponding in number to the first trim signals; and
    a primary circuit having a trimmable parameter and coupled with the programmable trimming circuit and with the test circuit, the primary circuit receiving the first or second trim signals when the test circuit is disabled or enabled, respectively.

7. The integrated circuit of claim 6 wherein the trimming circuit is coupled with the primary circuit by the test circuit, the test circuit in the disabled mode being operable to cause the first trim signals to be applied to the primary circuit.

8. The integrated circuit of claim 6 wherein the trimming circuit is coupled with the primary circuit by the test circuit, the test circuit in the enabled mode being operable to apply the second trim signals in substitution for the first trim signals.

9. The integrated circuit of claim 6 wherein each of the programmable elements includes a fuse.

10. The integrated circuit of claim 6 wherein the trimming circuit is coupled with the primary circuit by the test circuit, the test circuit receiving a plurality of test signals having first or second logic levels, the test circuit further receiving the first trim signals and producing the second trim signals, each having the first or second logic level in correspondence with the combination of logic levels of respective ones of the first trim signals and test signals.

11. The integrated circuit of claim 10 wherein the test circuit includes a NOR gate operable to receive input signals having logic states corresponding with the logic states of one of the first trim signals and a corresponding one of the test signals.

12. In an integrated circuit having a circuit with an adjustable parameter that is adjusted in accordance with programmable logic states of a plurality of programmable elements, a method of testing adjustment of the adjustable parameter, comprising applying to the circuit a trimming signal having a logic state determined by the combination of the logic states of a test signal and the unprogrammed programmable elements to adjust the adjustable parameter without programming any of the programmable elements.

13. The method of claim 12 wherein applying the trimming signal comprises:
   determining the logic state of the test signal;
   determining the logic state of the unprogrammed programmable elements;
   if the test signal has a first logic state, then producing the trimming signal having the first logic state;
   if the test signal has a second logic state, then producing the trimming signal having a logic state corresponding to the logic state of programmed programmable elements; and
   providing the resulting trimming signal to the circuit.

14. The method of claim 12 wherein applying a trimming signal comprises:
   determining the logic state of the test signal;
   if the test signal has a first logic state, then providing the trimming signal of the first logic state; and
   if the test signal has a second logic state, then providing a trimming signal having the logic state of the unprogrammed programmable elements to the circuit.

15. The method of claim 12 wherein applying the trimming signal comprises comparing the logic states of the unprogrammed programmable elements and the test signal and providing the resulting trimming signal to the circuit.

16. The method of claim 15 wherein comparing the logic states of the unprogrammed programmable elements and the test signals comprises logically NORing the inverted logic state of the unprogrammed programmable elements with the logic state of the test signal.

17. A method for adjusting a programmable parameter of a circuit programmed by programming programmable elements to an appropriate logic state, the method comprising:
   providing to the circuit an adjustable trimming signal having a logic state adjustable in response to test signals to select a particular programmable parameter of the circuit, the test signals having logic states corresponding to the logic states of the programmable elements programmed in a manner that programs the circuit to the particular programmable parameter; and
   adjusting the test signal to a different logic state to change the programmable parameter of the circuit to a different programmable parameter.

18. The method of claim 17 wherein providing an adjustable trimming signal comprises:
   determining the logic state of the test signal;
   determining the logic state of the unprogrammed programmable elements;
   if the test signal has a first logic state, then providing to the circuit an adjustable trimming signal having the first logic state; and
   if the test signal has a second logic state, then providing to the circuit a trimming signal having a logic state corresponding to the logic state of unprogrammed programmable elements.

19. The method of claim 17 wherein providing the trimming signal comprises:
   determining the logic state of the test signal;
   if the test signal has a first logic state, then providing to the circuit a trimming signal having the first logic state; and
   if the test signal has a second logic state, then passing to the circuit as the adjustable trimming signal having the logic state of the unprogrammed programmable elements.

20. The method of claim 17 wherein providing the trimming signal to the circuit comprises comparing the logic states of the unprogrammed programmable elements and the test signal.

21. The method of claim 20 wherein comparing the logic states of the programming and the test signals comprises NORing the inverted logic state of the unprogrammed programmable elements with the logic state of the test signal.

22. In an integrated circuit having a primary circuit with an adjustable circuit parameter and a programmable trimming circuit which provides a programming signal having first and second logic states for adjusting the adjustable circuit parameter, a method of testing adjustment of the adjustable circuit parameter, comprising the steps of:
   receiving a test signal having first and second logic states;
   receiving the programming signal;
   producing a trimming signal having a logic state determined by the combination of logic states of the test and programming signals; and
   applying the trimming signal to the primary circuit.

23. The method of claim 22 wherein the step of producing a trimming signal includes the steps of:
   determining the logic state of the test signal;
   determining the logic state of the programming signal;
   if the test signal has the first logic state, then producing the trimming signal of the first logic state; and
   if the test signal has the second logic state, then producing the trimming signal of a logic state corresponding to the determined logic state of the programming signal.

24. The method of claim 22 wherein the step of producing a trimming signal includes the steps of:
   determining the logic state of the test signal;
   determining the logic state of the programming signal;
   if the test signal has the first logic state, then producing the trimming signal of the first logic state; and
   if the test signal has the second logic state, then producing the trimming signal of the same logic state as the determined logic state of the programming signal.

25. The method of claim 22 wherein the step of producing a trimming signal includes the steps of:
   determining the logic state of the test signal;
   if the test signal has the first logic state, then producing the trimming signal of the first logic state; and
   if the test signal has the second logic state, then passing the programming signal as the trimming signal.

26. The method of claim 22 wherein the step of producing a trimming signal includes the step of comparing the logic states of the programming and the test signals.

27. The method of claim 26 wherein the step of comparing the logic states of the programming and the test signals includes the step of NORing the inverted logic state of the programming signal with the logic state of the test signal.

28. In an integrated circuit having a primary circuit with an adjustable circuit parameter and a programmable trimming circuit which provides a trimming signal having first and second logic states for adjusting the adjustable circuit parameter, a method of testing adjustment of the adjustable circuit parameter, comprising the steps of:

producing a test signal;

intercepting the trimming signal; and substituting the trimming signal with the test signal.

29. The method of claim 28 wherein the step of intercepting the trimming signal includes the steps of:

receiving the trimming signal; and producing a signal whose logic state is independent of the logic state of the trimming signal.

30. The method of claim 28 wherein the step of substituting the trimming signal with the test signal includes the step of applying a signal corresponding to the test signal to the primary circuit.

31. In an integrated circuit having a voltage regulator with an adjustable output voltage and a programmable trimming circuit which provides a fuse signal having asserted and deasserted states for adjusting the output voltage, a method of testing adjustment of the output voltage, comprising the steps of:

receiving a test signal having asserted and deasserted states;

receiving the fuse signal;

producing a trimming signal having one of asserted and deasserted states in correspondence with the combination of states of the test and fuse signals; and applying the trimming signal to the voltage regulator.

32. The method of claim 31 wherein the step of producing a trimming signal includes the steps of:

determining the state of the test signal;

determining the state of the fuse signal;

if the test signal has the asserted state, then producing the trimming signal of the asserted state; and if the test signal has the deasserted state, then producing the trimming signal of the same state as the determined state of the fuse signal.

33. The method of claim 31 wherein the step of producing a trimming signal includes the steps of:

determining the state of the test signal;

if the test signal has the asserted state, then producing the trimming signal of the asserted state; and if the test signal has the deasserted state, then passing the programming signal as the trimming signal.

34. The method of claim 31 wherein the step of producing a trimming signal includes the step of comparing the states of the programming and the test signals.

35. A method of testing a parameter of an integrated circuit and then trimming the circuit component in the integrated circuit in accordance with the testing, the method comprising:

adjusting a characteristic of the circuit component responsive to a trim signal present in the integrated circuit, the trim signal being capable of having a plurality of different values each of which corresponds to a respective characteristic of the circuit component;

sequentially altering the value of the trim signal;

testing the integrated circuit at each value of the trim signal;

based on the testing, determining which value of the trim signal causes the circuit component to provide optimum performance of the integrated circuit; and programming the integrated circuit to maintain the trim signal at the value that caused the circuit component to provide optimum performance of the integrated circuit.

36. The method of claim 35 wherein the act of sequentially altering the value of the trim signal comprises applying an external test signal to the integrated circuit that may have a plurality of values, setting the value of the trim signal to correspond to the value of the external test signal, and sequentially altering the value of the test signal.

37. The method of claim 35 wherein the act of programming the integrated circuit comprises programming a plurality fusible elements in a combination corresponding to the value of the trim signal that caused the circuit component to provide optimum performance of the integrated circuit.

38. The method of claim 35 wherein the act of testing the integrated circuit at each value of the trim signal comprises measuring and storing the value of the parameter of the integrated circuit at the current value of the trim signal.

* * * * *

UNITED STATES PATENT AND TRADEMARK OFFICE
CERTIFICATE OF CORRECTION

PATENT NO.    : 6,367,039 B1
DATED         : April 2, 2002
INVENTOR(S)   : Scott Derner It is certified that error appears in the above-identified patent and that said Letters Patent is hereby corrected as shown below:

<u>Title page,</u>
Inventor, reads "Boise, ID" should read -- Meridian, ID --

<u>Column 10,</u>
Line 32, reads "fusible" should read -- of fusible --

Signed and Sealed this

Eighth Day of October, 2002

*Attest:*

*Attesting Officer*

JAMES E. ROGAN
*Director of the United States Patent and Trademark Office*